United States Patent
Cortes et al.

(10) Patent No.: US 9,297,864 B2
(45) Date of Patent: Mar. 29, 2016

(54) CURRENT METERING AND ABNORMAL EVENT MONITORING SYSTEM

(75) Inventors: Timothy Martin Cortes, Mechanicsville, VA (US); Gordon Earl Flynn, Glen Allen, VA (US); Nesa Kumaran Kandaiah, Glen Allen, VA (US)

(73) Assignee: Power Distribution, Inc., Richmond, VA (US)

( * ) Notice: Subject to any disclaimer, the term of this patent is extended or adjusted under 35 U.S.C. 154(b) by 946 days.

(21) Appl. No.: 13/106,566

(22) Filed: May 12, 2011

(65) Prior Publication Data

US 2011/0288799 A1 Nov. 24, 2011

Related U.S. Application Data

(60) Provisional application No. 61/346,078, filed on May 19, 2010.

(51) Int. Cl.
| | |
|---|---|
| *G06F 19/00* | (2011.01) |
| *G01R 33/07* | (2006.01) |
| *G01R 15/20* | (2006.01) |
| *G01R 33/00* | (2006.01) |
| *G01R 35/04* | (2006.01) |

(52) U.S. Cl.
CPC ............ *G01R 33/072* (2013.01); *G01R 15/207* (2013.01); *G01R 33/0011* (2013.01); *G01R 35/04* (2013.01)

(58) Field of Classification Search
CPC .............. G01R 15/207; G01R 33/072; G01R 33/0011; G01R 35/04
USPC .................................................. 324/126, 127
See application file for complete search history.

(56) References Cited

U.S. PATENT DOCUMENTS

| | | | | |
|---|---|---|---|---|
| 4,059,798 | A * | 11/1977 | Dierker et al. | 324/127 |
| 4,322,709 | A | 3/1982 | Vonder | |
| 5,426,360 | A * | 6/1995 | Maraio et al. | 324/126 |
| 6,686,730 | B2 | 2/2004 | Marasch | |
| 6,734,661 | B2 | 5/2004 | Colby | |
| 6,809,509 | B2 * | 10/2004 | Bruno et al. | 324/157 |
| 6,836,107 | B2 * | 12/2004 | Mende | 324/117 H |
| 7,265,531 | B2 | 9/2007 | Stauth | |
| 7,298,132 | B2 | 11/2007 | Woolsey | |
| 7,538,540 | B2 | 5/2009 | Tsukamoto | |
| 7,714,588 | B2 | 5/2010 | Montreuil | |
| 8,680,856 | B2 * | 3/2014 | Schmitt | 324/252 |
| 2009/0278526 | A1 | 11/2009 | Yoshida | |
| 2010/0237853 | A1 * | 9/2010 | Bose et al. | 324/117 H |

\* cited by examiner

*Primary Examiner* — Patrick Assouad
*Assistant Examiner* — Haidong Zhang
(74) *Attorney, Agent, or Firm* — Snell & Wilmer LLP

(57) ABSTRACT

An MMS sensor assembly includes a U-shaped bottom housing that forms a recess in which is received a conductor whose current is to be sensed and a top housing arranged to be removably latched to the bottom housing. At least one magnetic field sensor is situated within the top housing, such the magnetic field sensor is positioned adjacent the conductor when the top housing is latched to the bottom housing, and is removable from the sensor assembly for repair or replacement. Circuitry connected to the magnetic field sensor includes a data storage device to store correction/compensation tables and/or equations for self-calibration or correction of the sensor.

20 Claims, 3 Drawing Sheets

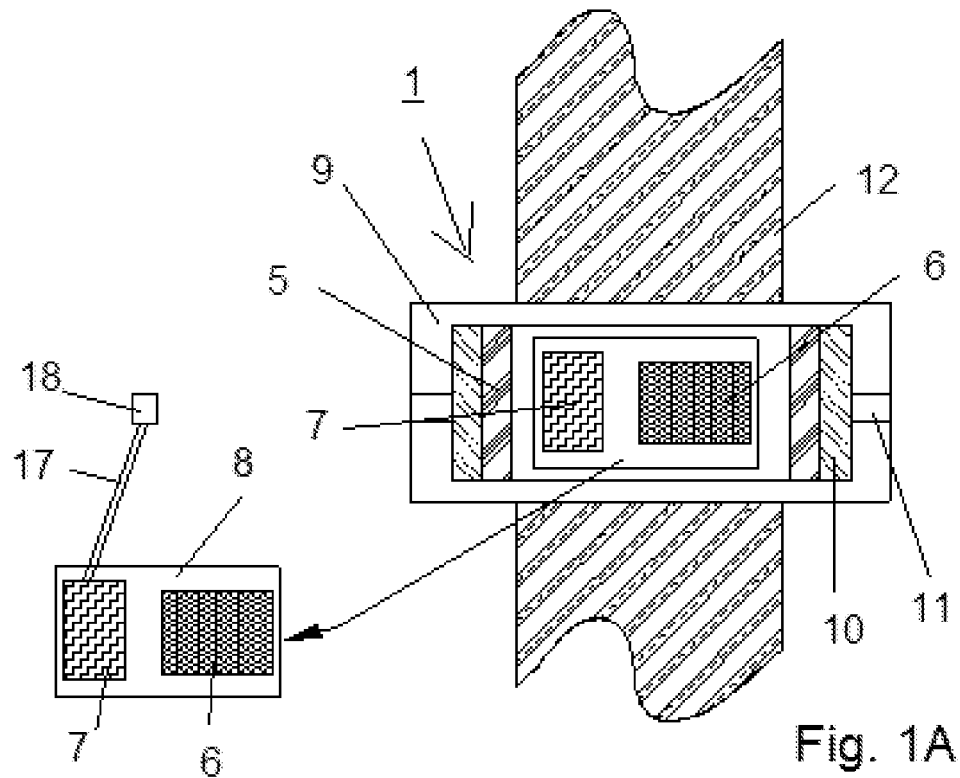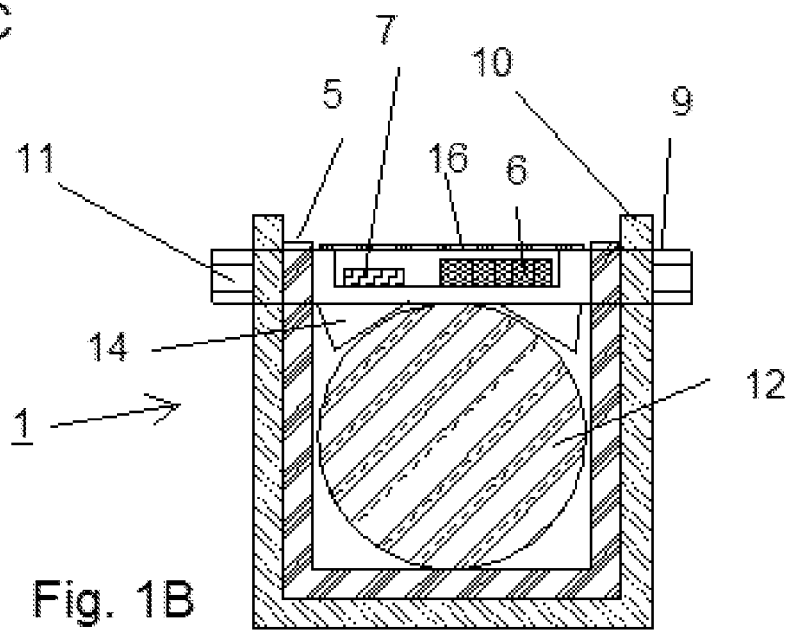

CURRENT METERING AND ABNORMAL EVENT MONITORING SYSTEM

This application claims the benefit of provisional U.S. Patent Appl. Ser. No. 61/346,078, filed May 19, 2010.

BACKGROUND OF THE INVENTION

1. Field of the Invention

The invention relates to a current metering and abnormal event monitoring system (MMS) which can continuously monitor the current flow to electrical equipment, and in particular to an MMS current sensor assembly that can readily be installed in a variety of site configurations to accommodate different numbers of conductors, conductor sizes, and configurations.

The invention also relates to an MMS current sensor assembly of the invention with integrated self-calibration, processing, display, and/or communications capabilities that enable the sensor assembly to be used to monitor and alarm a wide variety of different power parameters, and whose individual components are arranged for installation, repair, and/or replacement with minimal downtime, thereby making the MMS current sensor assembly especially suitable for mission critical applications.

2. Description of Related Art

The rigorous demands of mission critical sites, like data centers, require close to "real time" methods of metering and monitoring, displaying and/or alarming of power parameters that could cause anomalies in the site mission. Since the MMS is a current "watch dog" of the mission critical production equipment, the accuracy must be great enough to detect any anomalies that would affect production costs or "thru-put". The system should be accurate, and must have a minimum loss of data when repair is required.

System accuracy is important, by way of example, in the following power usage monitoring applications:

Billing of power used for leased space; power used is sometimes proportioned to current drawn.

Verification of equipment operation; increase or decrease of current metrics could indicate equipment failure or degradation.

Verification of redundant server operation; if one server goes "off line" the current to units of the redundant pair will be unbalanced.

In addition to monitoring total power usage for billing or operation verification, the MMS may be required to check for power anomalies indicative of "abnormal events" such as:

Arcs that cause arc flash damage to equipment and injury to personnel.

Leakage currents to ground or other conductors, indicating potentially failing equipment.

Even current harmonics in AC power system which may indicate failing equipment.

Overload currents.

Current unbalances in redundant equipment indicating loss of redundancy.

Current dropping to near zero after being normal, indicating equipment failure.

Thus, the current sensor must be able to respond both to rapid changes in current, even current harmonics (which include DC), large and small amplitude fluctuations, and so forth. This requires a high degree of flexibility, including a high current sensing bandwidth, and the ability to implement a wide variety of different current monitoring algorithms.

Individual sensors having sufficient bandwidth to monitor both AC and DC currents are known. One such sensor is disclosed in U.S. Pat. No. 7,298,132. However, sensors such as the one shown in U.S. Pat. No. 7,298,132 are difficult to install, because they require disconnection of the conductors to be monitored, and because they require complex calibration procedures that require a skilled operator. In addition, such individual sensors lack integrated processing, display, and communications capabilities.

Self-calibrating sensors are also known. One such sensor is disclosed in U.S. Pat. No. 6,734,661. Again, however, the known sensor is difficult to install and is relatively limited in application. For example, the sensor of U.S. Pat. No. 6,734,661 is exclusively an AC sensor, and thus cannot be used to monitor even harmonics or other conditions that may involve detection of DC currents.

A current sensor unit having an integrated signal processor for detecting electrical disturbances and for communicating data to a network is disclosed in U.S. Pat. No. 7,714,588. However, this sensor unit also lacks the ability to adapt to different wiring configurations and monitoring requirements.

Additional prior patents and publications directed to sensor units include U.S. Pat. No. 6,680,730, which discloses a current sensor having a clip member to facilitate mounting of the core on a conductor; U.S. Patent Publication No. 2009/0278526, which discloses a current sensor that includes Hall elements situated on a circuit board in an opening of a magnetic core surrounding a bus bar, with additional amplifier elements on the circuit board, and U.S. Pat. No. 7,265,531, which discloses a Hall effect current sensor and core that fit into specially designed recesses on opposite sides of a bus bar.

None of the prior current sensors offer a complete solution to the problem of current monitoring in mission critical applications, either because they are difficult to install, leading to increased downtime for repair or replacement, can only be installed on specific wiring configurations, necessitating the purchase and installation of multiple different current sensors for different purposes in a single installation, or lack sufficient bandwidth or processing/communication capabilities to carry out a full complement of monitoring and alarm functions.

SUMMARY OF THE INVENTION

It is therefore an objective of the invention to provide a current metering and abnormal event monitoring system (MMS) that is capable of continuously monitoring current flow to load equipment in a variety of different applications, including those that may be considered to be mission critical.

It is further objective of the invention to provide an MMS current sensing assembly that has a low Mean Time To Repair (MTTR) to avoid repair delay and to avoid the nuisance of shutting down modules or sensors not being repaired or replaced.

To achieve these objectives, a preferred embodiment of the invention provides an MMS current sensor assembly having one or more of the following features and/or capabilities:

(a) Integral Analysis/Display/Communications
circuitry/components included within the MMS current sensing assembly for providing local analysis and display of the metered data, and/or communication of data for remote display or analysis.

(b) Ease of Installation/Mechanical Adaptability
arrangement of the MMS sensor assembly in sections to accommodate single or multiple conductors, and to permit addition or removal of conductors without disturbing other sections;
a quick release top housing that can move up and down to fit the size of the conductors;

inclusion or embedding of circuitry/components, including magnetic field sensors, within the quick release top housing for ease-of-installation or removal for replacement or repair;

an open U field concentrator that shields the magnetic field sensor from external fields without interfering with sensor installation.

(c) Electrical Adaptability use of high bandwidth current sensors capable of detecting both AC and DC currents;

provision for calibration data storage, and/or correction/compensation and parameter tables of equations, for self-calibrating or correcting output of the sensors, including correction for any one or more of the following:

sensor linearity distortion;

sensor temperature variations;

sensor bandwidth and/or phase shift limitations;

conductor size, if necessary;

the presence of AC and/or DC currents in the conductor(s);

sensor variations in production lots; and scale factors of different sensors;

inclusion in each of the sensor sections of wire or wireless communications for transmitting data collected by individual sensors, and for communicating with the calibration data storage device; and abnormal event detection capabilities, with alarms and initiation of action if necessary.

It will be appreciated that the MMS current sensing assembly of the preferred embodiments may be combined, included in, embedded, or integrated with other equipment, e.g., as a sub-system in a more complex metering and abnormal event monitoring system, or it can be installed as a separate or stand-alone unit in any system that requires an AC and DC, high bandwidth current sensor, or that requires a general purpose current sensor that requires reduced downtime for repair or replacement and that can be adapted for a wide range of conductor sizes and configurations.

BRIEF DESCRIPTION OF DRAWINGS

FIGS. 1A and 1B are respective top and side views of one section of an MMS sensor assembly constructed in accordance with the principles of a preferred embodiment of the invention, in which the magnetic field sensor and associated circuit are situated in a module rather than "hard" mounted in the housing.

FIG. 1C is a top view of the sensor and circuit module illustrated in FIG. 1.

DETAILED DESCRIPTION OF PREFERRED EMBODIMENTS OF THE INVENTION

Figure 2:
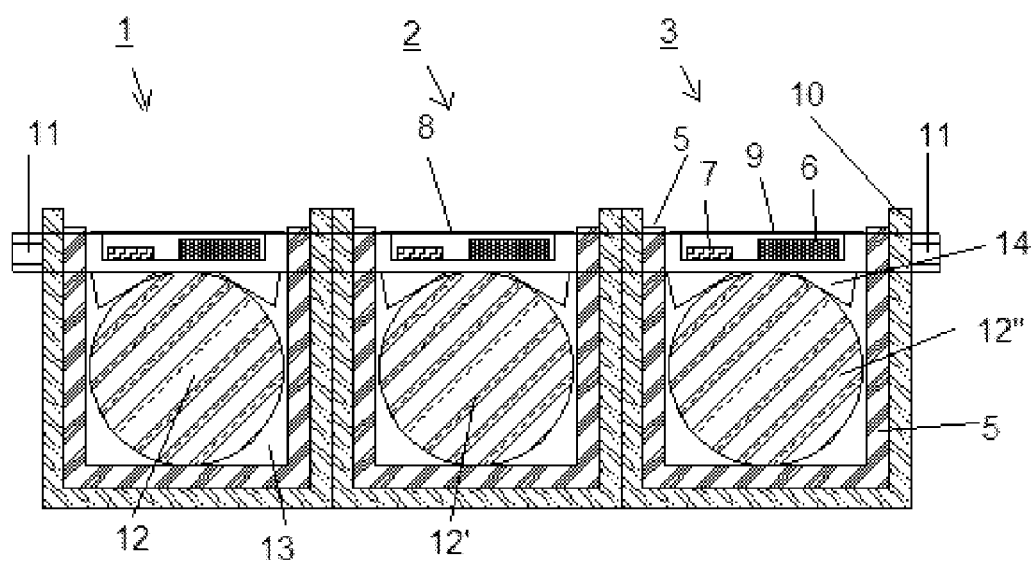
FIG. 2 shows an MMS ganged sensor assembly that includes multiple ganged sensor sections of the type illustrated in FIGS. 1A and 1B.
Figure 3:
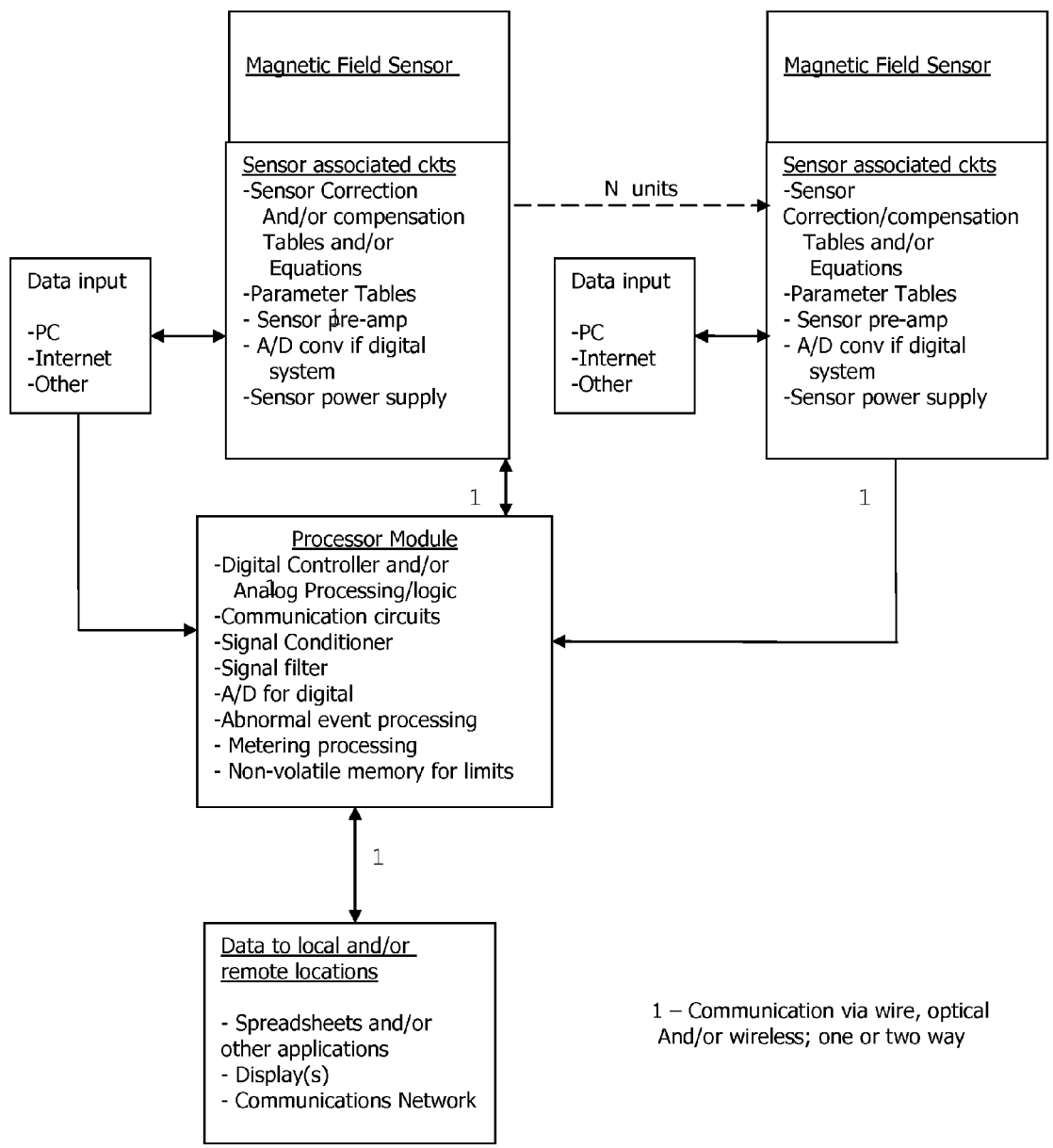
FIG. 3 is a schematic block diagram showing an arrangement of electrical components that may be used in connection with the sensor assembly of FIG. 1.

FIGS. 1A and 1B show a sensor section 1 that may be combined with other sensor sections 2 and 3 shown in FIG. 2, and with a processing module such as the processing module shown in FIG. 3, to form an integrated MMS current sensor assembly according to a preferred embodiment of the invention. The MMS current sensor assembly illustrated in FIGS. 1A, 1B, and 2 may be a separate or stand-alone device, or may be embedded in other equipment, and in addition can be used in more complex systems that meter and monitor current, voltage and other data to calculate power parameters like peak power, KW, KVA Power Factor, tending, etc. Most complex metering and monitoring systems use DC coupled voltage sensing so the addition of the "DC coupled" MMS sensor assembly of the preferred embodiment makes the system compatible with both AC or DC power delivery systems without sensor modification.

The single section 1 of the MMS sensor assembly, as illustrated in FIGS. 1A and 1B, includes a U-shaped concentrator 5 made of high magnetic permeability material to increase the sensitivity of sensor 6 and that serves to shield the sensor 6 from external fields. The sensor 6 and associated circuits 7 are mounted in a quick release top housing 9 that is removably coupled to a U-shaped bottom housing 10 arranged to receive the U-shaped concentrator 5. The provision of a quick release top housing 9 with embedded magnetic field sensors 6 and associated circuits 7 enables:

Quick replacement of the magnetic sensor and associated circuits;

The quick addition/removal of conductors 12;

The ease of installation of a new sensor module 8 in the field.

The magnetic field sensor and the sensor associated circuits can be mounted directly to the top housing 9 or mounted in a removable module 8. The removable module output connects to the external modules or circuits via the cable 17 and connector 18. If the magnetic field sensor and the associated circuits are mounted directly to the top housing, an I/O connector (not shown) can be part of the top housing 9 and a mating connector (not shown) may be mounted in the bottom housing 10.

Non-magnetic top housing 9 and non-magnetic bottom housing 10 may be coupled together by a latch, detent/groove, hook and slot, bolt and nut, set screws, springs, teeth/pawls, ratchets or any other releasable coupling mechanism or means 11. Preferably, the latched position of the top housing relative to the bottom housing is vertically adjustable to enable the top housing to be positioned in close proximity to conductors 12 of different size that are fitted in the cavity 13 formed by the U-shaped concentrator 5 and bottom housing 10. To properly position the conductor 12 relative to sensor 8, and to hold the conductor in place, the top housing may include extensions 14 arranged to engage conductors of different sizes and/or cross-sectional shapes.

In addition, a top shield 16 may be provided over a cavity in which the sensor 6 and associated circuitry are situated, both to shield the sensor from external fields and change sensor saturation characteristics, as well as to provide access to the sensor and circuitry. It will be appreciated, however, that the sensor and/or any circuitry may also be embedded with an integral top housing/shield assembly, or otherwise mounted to the top housing in any convenient fashion.

The associated circuitry 7 is arranged to communicate with a processing module that may be mounted in a separate section or area of the sensor assembly, or with a remote processing/monitoring device or server. To this end, the associated circuitry 7 may be connected to the processing module or remote processor by wireless communication links or by a wired communication link (represented by cable 17) through which:

data collected by the sensor may be transmitted; and data may be transmitted to and received from the sensor data storage device.

The open "U" magnetic field concentrator 5 and the top shield 16 combine to shield the magnetic field sensor from external fields that could affect sensor performance. The external fields can emanate from nearby magnetic components, like transformers, or nearby current carrying conductors or even the Earth's magnetic field. The strength of Earth's magnetic field at the surface ranges from 30 micro-tesla (0.3 gauss) to 60 micro-tesla (0.6 gauss) around the magnetic poles. AC magnetic fields can cause system "noise" or inaccuracies while DC fields like the Earth's magnetic field can generate residual magnetism in the "U" and top shield concentrator/shield. As a result, the concentrator/shield metal should have high permeability, low coercivity, and low magnetostriction. Suitable metals may include Permalloy, Mu-metal, or Supermalloy.

The concentrator/shield metal is preferably heat treated, for example by annealing, after bending and final forming. Annealing is especially preferred because it can increase magnetic permeability up to forty times by altering the material's crystal structure, aligning the grains and removing impurities like carbon that obstruct the free motion of the magnetic domain boundaries. Annealing the open "U" concentrator/shield also reduces residual magnetism. In addition, the preferred combination of an annealed open "U" magnetic field concentrator/shield and top shield make the MMS sensor insensitive to the size of the conductor.

The sensor located in the top housing can be any magnetic field sensor, such as a conventional Hall Effect sensor or CMOS Hall Effect devices. In addition, components of the illustrated associated circuitry 7 may include, but are not limited to:
  Non-volatile memory for the correction/compensation tables and/or equations, as discussed in more detail below;
  A stable pre-amp, such as a chopper stabilized unit, to amplify the magnetic field sensor output signal; and
  An A/D converter if the system is digital and the A/D is not located in another circuit module.

In order to achieve self-calibration or correction, a non-volatile memory or other data storage device is preferably associated with each magnetic field sensor. The purpose of the memory or storage device is to store correction/compensation tables and/or equations that may be used, by way of example and not limitation, to:
  Correct/compensate for magnetic field or sensor linearity distortion;
  Correct/compensate for magnetic field or sensor temperature variations;
  Correct/compensate for magnetic field or sensor bandwidth limitations;
  Correct for conductor size, if necessary;
  Configure for AC or DC in the conductors, if necessary;
  Correct/compensate for sensor variations in production lots;
  Correct/compensate for any other magnetic field or sensor distortion;
  Alarm abnormal events when preset limits are exceeded, time-date stamp the event and store the data;
  Provide historical data in order to display:
    Trend lines of load currents;
    Graphics of waveforms;
    Peak current analysis; and
    Harmonic distortion and THD,
    so that the operator, by observing trending, graphic waveforms, etc, can predict abnormal events before they actually happen.
  Suitable algorithms for implementing the calibration or corrections and arranging the data and equations in the memory/data storage for the purposes listed above are in general known and form no part of the present invention, which can use any such data, equations, or self-calibration/correction algorithms.

To achieve the above-described self-calibration or correction, the MMS assembly of a preferred embodiment uses correction/compensation and parameter tables or equations stored in on-board, non-volatile memory included in a removable housing part for quick field repair. The tables/equations are generated in factory testing and downloaded into on-board memory and/or down loaded in the field from a factory data base. Using these tables the MMS sensors and/or circuits can self adapt and self calibrate to adjust for non-prefect components and adjust for production lot variances when the MMS sensors and/or circuits is placed in a system. This process of self adapting and self calibrating standardizes the performance of each of the MMS sensors and/or circuit modules manufactured with the same part number. The standardized MMS sensors and/or circuit module can be installed in current sensor assembly without loss of performance and without time loss for manual adjustments and/or calibration requiring current flow in the conductors. The data collected can be displayed locally or transmitted to remote locations for display or analysis.

The correction/compensation and parameter tables or equations when generated by factory test equipment may be stored in a factory data base and identified by part number and serial number. These tables can then be automatically retrieved via the internet or other methods and downloaded into the MMS sensors and/or circuits to adapt and calibrate components to the system requirements. If communications to the remote database are not available, the tables can be retrieved to a device like a PC, off or on site, and then down loaded to the "on-board-memory."

Since the MMS sensor and the processor module has correction/compensation tables and/or equations no scale factor calibration is required. However, those skilled in the art will appreciate that offset due to residual magnetism in the shield must be considered. Residual magnetism is of no concern in AC only systems where even harmonics or DC currents are not required to be metered/monitored. However in systems that require metering/monitoring of even harmonics or DC current the residual magnetism must be cancelled. Cancellation of residual magnetism after the MMS sensor assembly is in place can be accomplished by placing the processor in "set-up" mode with zero current in the conductor. In a "set-up" mode, the processor records the off-set signal caused by the residual magnetism. The off-set data is stored and corrects sensor DC related signals.

In addition to self-calibration, the use of onboard correction/compensation table can be used for monitoring applications that require dynamic correction capabilities, such as abnormal event detection. Since overload currents can be transient surges or continuous, the MMS sensor and associated circuits must have a natural or corrected dynamic range so the components will not saturate before the upper end limit signal is reached. An example is arc current. The system must have enough dynamic range to detect at least a 30% of branch short circuit. High harmonic current may have a crest factor of 3 or more; the peak current amplitudes can be three times the RMS current amplitudes. The MMS sensor does not "flat top" in the saturation region but only changes slope. The correction/compensation tables or equations can extend the sensor dynamic range without sacrificing low end sensitivity.

The MMS sensor assembly of the illustrated embodiment can be configured for a single section as shown in FIG. 1 or configured in a ganged arrangement as shown in FIG. 2. In the ganged arrangement each magnetic field sensor and associated circuits should be contained in removable modules to allow replacement of a defective sensor/circuit in one sensor section without disturbing operation of the other sensor sections. Those skilled in the art will appreciate that the units do not need to be lined up, but may be staggered or arranged in any other desired geometrical configuration without departing from the scope of the invention.

The on-board processing circuitry in each section may be individually or commonly programmed to detect a wide variety of events, including leakage currents, arcs, even harmonics in an AC power system, overload currents, current imbalances in redundant equipment that indicated a loss of redundancy. Algorithms for analyzing currents to detect such events are known, and any such current analysis procedures/algorithms may be used in connection with the claimed invention. The ability to monitor both DC and AC waveforms is especially useful for detecting conditions that involve odd and even harmonic components, such as arc current signatures, although the invention is not limited to arc current detection or any other particular abnormal event detection.

To use arc detection as an example of a particular event that may be monitored by the MMS sensor assembly of the preferred embodiment of the invention, it is known that to prevent injury to personnel and to prevent damage to monitored equipment, the source supplying power to the arc must be shut down within 20 Ms from the start of the arc. Since the power source protective device or disconnect device may take 16 Ms to open, the MMS must detect, alarm and issue a shut down signal within 4 Ms. To avoid nuisance shut down of equipment power supply, the MMS processor must logically "AND" two or more arc parameters. For example, two arc current parameters that can be logically "ANDed" are:

Current with amplitudes over 30 to 40% of short circuit current amplitudes.

Higher order odd harmonics and even harmonics.

The MMS current assembly of the preferred embodiment is especially suited to carry out this task since a single sensor can be used to detect both odd and even harmonics, and the results can be immediately processed by onboard circuit to immediately recognize when the both of the two above arc parameters simultaneously exceed preset limits and issue a "shut down" signal.

Another example of an abnormal event that can advantageously be monitored by the MMS assembly of the present invention, and in particular by the arrangement of multiple sensors in a single assembly, is current leakage detection, which requires measurement of the current in all conductors, including neutral, that supply current to each piece of load equipment. When the leakage exceeds a preset limit the event is alarmed. If the leakage is large enough to exceed the "shut down" limit the MMS can issue a "shut down" preset signal which can be used to shut down the equipment that has the excessive leakage.

To accomplish leakage detection, the vector sum of all the currents should be zero if there is no leakage. If all the load conductors can be run through separate MMS sensors, the system processor could do the vector addition and determine the leakage current. The processor method, in a multi-conductor system may not be as cost effective as running multi-conductors through a single MMS sensor.

Another abnormal event detection application for which it may be advantageous to use the MMS current monitor of the preferred embodiment involves the detection of even harmonics. Even harmonics represent DC current and do not normally occur in AC power delivery systems with amplitude over 2 to 5%. Even harmonics occur when the positive half cycle volt-seconds of the waveform are not equal to the negative half cycle volt-seconds. The abnormal event of even harmonic current exceeding the preset limit indicates faulty load equipment. Some of the circuit failures that can cause even harmonics or DC current are: (a) one or more active component has failed in the input rectifier or AC to DC converter of the load equipment; (b) one or more active power component has failed in a static switch; (c) one or more active power component has failed in the bypass circuits of the load equipment, or (d) arcs (discussed above). The MMS current sensor will respond to the DC superimposed on the AC currents waveforms and has a high bandwidth. Therefore the MMS current sensor can capture the arc current signature containing even and odd harmonic components. Even harmonics or DC current will overheat power delivery systems and/or cause saturation effects in magnetic components. In the MMS current sensor of the preferred embodiment, when even harmonics exceed a preset limit, the event may be alarmed and, if DC current is large enough to exceed the "shut down" limit, the MMS can issue a "shut down" preset signal which can be used to shut down the equipment that has the excessive leakage.

As noted above, the MMS current sensor assembly of the preferred embodiment is not limited to abnormal event monitoring, but rather is applicable to any current monitoring application, such as current balancing. If the equipment powered by the power delivery system is redundant, the redundant equipment components should draw approximately the same amount of current. The current unbalanced can be monitored using the methods described above in connection with leakage currents. If the load equipment is single phase, only one power feed from each load need to be routed through the MMS sensor. The processor can also determine unbalances and alarm based on preset unbalance limits for load tagged to be redundant.

FIG. 3 schematically illustrates an exemplary processing module that may be used with the sensor assembly of FIGS. 1A-1C and 2. A typical processor module could contain, but is not limited to, the following elements:

Signal conditioning/enhancing for each sensor/sensor circuit based on the correction/parameter tables or equations;

A communications interface for two way communication to MMS sensor assembly;

An A/D converter interface and processing if the MMS sensor module output is from an A/D converter;

Digital conditioning and signal correcting, if required, using sequential logic and/or controllers such as DSP, FPGA, microprocessor and/or other controllers;

Optional analog conditioning and signal correcting using analog circuits having discrete components and/or analog circuit modules and/or analog controllers;

Filtering circuits to reduce unwanted signals and/or to improve signal-to-noise ratios;

A display driver for local display(s);

A driver to port data to applications like Excel spreadsheets if required by a particular application;

A remote communication driver if required by a particular application.

Those skilled in the art will appreciate that the signal conditioning and signal correcting components may include an A/D converter if the sensor output is analog, and/or sequential logic and/or a DSP, FPGA, microprocessor and/or other controllers. Analog conditioning would use analog circuits using discrete components and/or analog computer circuits or modules.

The controller (analog or digital) downloads all the tables and/or equations from the MMS sensor assembly, makes the necessary compensation and corrections to the sensor signal, and transmits the signal to an accumulator module and/or the display module or any other module and/or display.

If the MMS is part of a more complex metering and abnormal event monitoring system, the MMS can generate or receive and process time coherent signals. Time-coherent data is required to generate some functions like KW and/or power factor which requires processing or sampling multiple sensor outputs simultaneously. The time-coherent signal and function generation can be located in one sub-system and transmitted to all other sub-systems.

The processor module preferably can port data to applications like Excel spreadsheets. This porting function allows the user to directly control the way the data is displayed. The acquired data may be displayed in a user defined format, analyzed, or recorded, or some combination thereof. The applications may be controlled by commercial software or by custom programs developed using various general purpose programming languages.

Having thus described a preferred embodiment of the invention and variations of the preferred embodiment in sufficient detail to enable those skilled in the art to make and use the invention, it will nevertheless be appreciated that numerous variations and modifications of the illustrated embodiment may be made without departing from the spirit of the invention. Accordingly, it is intended that the invention not be limited by the above description or accompanying drawings, but that it be defined solely in accordance with the appended claims.

What is claimed is:

1. A current metering and abnormal event monitoring device comprising:
    a bottom housing defining an opening;
    a concentrator having a magnetically permeable material, defining a recess designed to receive a conductor, and configured to be received by and coupled to the bottom housing;
    a top housing defining a sensor cavity and having a coupling mechanism configured to removably couple the top housing to the bottom housing;
    a sensor module configured to be coupled to the top housing and positioned in the sensor cavity and having:
        a magnetic field sensor configured to be positioned proximate to the conductor when the top housing is removably coupled to the bottom housing and configured to detect a magnetic field,
        a memory configured to store at least one of a correction table or a compensation table, and
        a processor configured to calibrate the sensor module to adjust for variances when current is flowing through the conductor based on the at least one of the correction table or the compensation table; and
    a top shield coupled to the top housing such that when the top housing is coupled to the bottom housing, the top shield and the concentrator at least partially shield the sensor module from magnetic fields external to the current metering and abnormal event monitoring device.

2. The current metering and abnormal event monitoring device of claim 1 wherein the magnetic field sensor is a sensor having a sufficient bandwidth to monitor magnetic fields corresponding to both AC currents and DC currents.

3. The current metering and abnormal event monitoring device of claim 2 wherein the processor is further configured to compensate for effects of residual magnetism when the conductor is carrying DC current.

4. The current metering and abnormal event monitoring device of claim 1 wherein the processor is configured to adjust for variances further based on the detected magnetic field.

5. The current metering and abnormal event monitoring device of claim 1 wherein the coupling mechanism is adjustable such that a distance between the top housing and the bottom housing can be varied when the top housing is removably coupled to the bottom housing by adjusting the coupling mechanism.

6. The current metering and abnormal event monitoring device of claim 1 wherein the processor is further configured to analyze the detected magnetic field, to determine that an undesired event has occurred based on the detected magnetic field and to generate an alert signal in response to determining that the undesired event has occurred.

7. The current metering and abnormal event monitoring device of claim 6 wherein the undesired event includes at least one of an arc, a current leak, a short circuit or an undesired DC current.

8. The current metering and abnormal event monitoring device of claim 6 wherein the processor is further configured to monitor for undesirable events by analyzing magnetic fields corresponding to AC current and magnetic fields corresponding to DC current.

9. The current metering and abnormal event monitoring device of claim 1 wherein the variances include at least one of linearity distortion of the magnetic field sensor, temperature variations of the magnetic field sensor, bandwidth limitations of the magnetic field sensor, phase shift limitations of the magnetic field sensor, a diameter of the conductor or scale factors of the magnetic field sensor.

10. The current metering and abnormal event monitoring device of claim 1 wherein the top shield covers the sensor cavity in order to change saturation characteristics of the magnetic field sensor and to provide access to the sensor module without removing the top housing.

11. A current metering and abnormal event monitoring device comprising:
    a bottom housing defining an opening;
    a concentrator having a magnetically permeable material, defining a recess designed to receive a conductor, and configured to be received by and coupled to the bottom housing;
    a top housing defining a sensor cavity and having a coupling mechanism configured to removably couple the top housing to the bottom housing;
    a sensor module configured to be coupled to the top housing and positioned in the sensor cavity and having:
        a magnetic field sensor positioned proximate to the conductor when the top housing is removably coupled to the bottom housing and configured to detect a magnetic field and having a sufficiently high bandwidth to detect magnetic fields corresponding to both AC current and DC current,
        a processor configured to receive detected off-set data from the magnetic field sensor when no current is flowing through the conductor and to compensate for effects of residual magnetism when the conductor is carrying DC current based on the off-set data, and
        a memory configured to store the off-set data; and
    a top shield coupled to the top housing such that when the top housing is coupled to the bottom housing, the top shield and the concentrator at least partially shield the sensor module from magnetic fields external to the current metering and abnormal event monitoring device.

12. The current metering and abnormal event monitoring device of claim 11 wherein the top shield covers the sensor cavity in order to change saturation characteristics of the magnetic field sensor and to provide access to the sensor module without removing the top housing.

13. The current metering and abnormal event monitoring device of claim 11 wherein the coupling mechanism is adjustable such that a distance between the top housing and the bottom housing can be varied when the top housing is removably coupled to the bottom housing by adjusting the coupling mechanism.

14. The current metering and abnormal event monitoring device of claim 11 wherein the processor is further configured to determine that an undesired event has occurred based on the detected magnetic field and to generate an alert signal in response to determining that the undesired event has occurred.

15. The current metering and abnormal event monitoring device of claim 14 wherein the undesired event includes at least one of an arc, a current leak, a short circuit or an undesired DC current.

16. The current metering and abnormal event monitoring device of claim 14 wherein the processor is further configured to monitor for undesirable events by analyzing magnetic fields corresponding to AC current and magnetic fields corresponding to DC current.

17. A current metering and abnormal event monitoring device comprising:
a U-shaped bottom housing;
a U-shaped concentrator fabricated of magnetic permeability material and positioned in the U-shaped bottom housing, the U-shaped concentrator forming a recess in which is received a conductor, the conductor being arranged to carry a current to be sensed; and
a top housing arranged to be removably latched to the U-shaped bottom housing, the top housing defining a sensor cavity, wherein:
a sensor module including at least one magnetic field sensor and circuitry connected to the at least one magnetic field sensor is mounted within the sensor cavity in the top housing such that the sensor module is removable with the top housing when the top housing is unlatched and removed from the U-shaped bottom housing,
the at least one magnetic field sensor is positioned adjacent the conductor when the top housing is latched to the U-shaped bottom housing to secure the conductor in the recess,
the U-shaped concentrator cooperates with a top housing magnetic shield member to shield both the conductor and the sensor module from external magnetic fields,
the circuitry is connected to the at least one magnetic field sensor and situated with the top housing and including a data storage device associated with each magnetic field sensor to store at least one of correction tables, compensation tables or equations to perform self-calibration or correction of the at least one magnetic field sensor, and
the magnetic shield member covers the sensor cavity in which the sensor module is situated in order to (a) change sensor saturation characteristics, (b) provide access to the sensor and to the circuitry from outside of the current metering and abnormal event monitoring device without removing the top housing, and (c) cooperate with the U-shaped concentrator to shield the sensor module from external magnetic fields.

18. The current metering and abnormal event monitoring device of claim 17 wherein the circuitry is further configured to determine that an undesired event has occurred based on a magnetic field detected by the magnetic field sensor and to generate an alert signal in response to determining that the undesired event has occurred.

19. The current metering and abnormal event monitoring device of claim 18 wherein the undesired event includes at least one of an arc, a current leak, a short circuit or an undesired DC current.

20. The current metering and abnormal event monitoring device of claim 18 wherein the circuitry is further configured to monitor for undesirable events by analyzing magnetic fields detected by the magnetic field sensor that correspond to AC current and to DC current.

* * * * *